United States Patent
Yamauchi (10) Patent No.: US 8,194,713 B2
(45) Date of Patent: Jun. 5, 2012

(54) OPTICAL SEMICONDUCTOR DEVICE

(75) Inventor: Yasuyuki Yamauchi, Kanagawa (JP)

(73) Assignee: Sumitomo Electric Device Innovations, Inc., Yokohama, Kanagawa (JP)

( * ) Notice: Subject to any disclaimer, the term of this patent is extended or adjusted under 35 U.S.C. 154(b) by 0 days.

(21) Appl. No.: 12/729,490

(22) Filed: Mar. 23, 2010

(65) Prior Publication Data

US 2010/0246627 A1 Sep. 30, 2010

(30) Foreign Application Priority Data

Mar. 25, 2009 (JP) ................................. 2009-074403

(51) Int. Cl.
*H01S 5/00* (2006.01)

(52) U.S. Cl. ............... 372/50.21; 372/20; 372/43.01; 372/50.1

(58) Field of Classification Search ........... 372/43.01, 372/50.1, 50.21, 20; 359/344
See application file for complete search history.

(56) References Cited

U.S. PATENT DOCUMENTS

| | | | |
|---|---|---|---|
| 6,567,437 B1 * | 5/2003 | Imaki et al. | 372/32 |
| 6,678,432 B2 * | 1/2004 | Shigeta et al. | 385/14 |
| 2001/0033592 A1 | 10/2001 | Yamauchi et al. | |
| 2003/0067948 A1 * | 4/2003 | Tatsuno et al. | 372/32 |
| 2003/0067949 A1 * | 4/2003 | Nasu et al. | 372/32 |
| 2003/0081637 A1 * | 5/2003 | Short | 372/18 |
| 2009/0022186 A1 * | 1/2009 | Tanaka et al. | 372/20 |
| 2009/0168817 A1 * | 7/2009 | Ishikawa et al. | 372/20 |
| 2009/0225801 A1 * | 9/2009 | Mori et al. | 372/29.011 |
| 2009/0238231 A1 * | 9/2009 | Yamane | 372/50.21 |

FOREIGN PATENT DOCUMENTS

JP 2001-308444 A 11/2001

* cited by examiner

*Primary Examiner* — Yuanda Zhang
(74) *Attorney, Agent, or Firm* — Westerman, Hattori, Daniels & Adrian, LLP (57) ABSTRACT

An optical semiconductor device includes: a beam splitter that splits an input optical axis into a first split axis having a first split angle and a second split axis having a second split angle larger than the first split angle; a first unit that is located on the first split axis of the beam splitter and has one or more optical components, an interval between a more distant end of the first unit and the beam splitter having a first length; a second unit that is located on the second split axis of the beam splitter and has one or more optical components, an interval between a more distant end of the second unit and the beam splitter having a second length larger than the first length; and an optical semiconductor element that has a first outputting end having a first output axis coupled optically to the input optical axis of the beam splitter, a second outputting end having a second output axis, and optical gain, the optical semiconductor element being inclined so that the second output axis is arranged away to a side of the second split axis from the first output axis.

8 Claims, 6 Drawing Sheets

OPTICAL SEMICONDUCTOR DEVICE

CROSS-REFERENCE TO RELATED APPLICATION

This application is based upon and claims the benefit of priority of the prior Japanese Patent Application No. 2009-074403, filed on Mar. 25, 2009, the entire contents of which are incorporated herein by reference.

BACKGROUND (i) Technical Field

The present invention relates to an optical semiconductor device having an optical semiconductor element having optical gain.

(ii) Related Art

A laser device (an optical semiconductor device), in which one of optical semiconductor elements having optical gain is combined with a wavelength locker including an etalon, is being known. The combination with the wavelength locker allows stabilization of output wavelength of the laser with high accuracy. Japanese Patent Application Publication No. 2001-308444 discloses such a laser.

The wavelength locker in the laser device is located on an output optical axis of the semiconductor laser. Therefore, the laser device extends in a direction along the output optical axis. There is a problem that it is difficult to downsize the laser device in which optical components such as the wavelength locker are combined.

Especially, a chip length of a wavelength tunable laser, in which a SG-DBR (Sampled Grating Distributed Bragg Reflector), a SG-DFB (Sampled Grating Distributed Feedback), and so on are coupled, may be large. There is a problem that it is difficult to downsize the laser device having the wavelength tunable laser.

SUMMARY

It is an object of the present invention to provide a downsized optical semiconductor device in which a packaging area of an optical semiconductor element and an optical component is reduced.

According to an aspect of the present invention, there is provided an optical semiconductor device comprising: a beam splitter that splits an input optical axis into a first split axis having a first split angle and a second split axis having a second split angle larger than the first split angle; a first unit that is located on the first split axis of the beam splitter and has one or more optical components, an interval between a more distant end of the first unit and the beam splitter having a first length; a second unit that is located on the second split axis of the beam splitter and has one or more optical components, an interval between a more distant end of the second unit and the beam splitter having a second length larger than the first length; an optical semiconductor element that has a first outputting end having a first output axis coupled optically to the input optical axis of the beam splitter, a second outputting end having a second output axis, and optical gain, the optical semiconductor element being inclined so that the second output axis is arranged away to a side of the second split axis from the first output axis.

DETAILED DESCRIPTION

A description will be given of laser devices in accordance with a first comparative example and a second comparative example.

First Comparative Example

Figure 1:
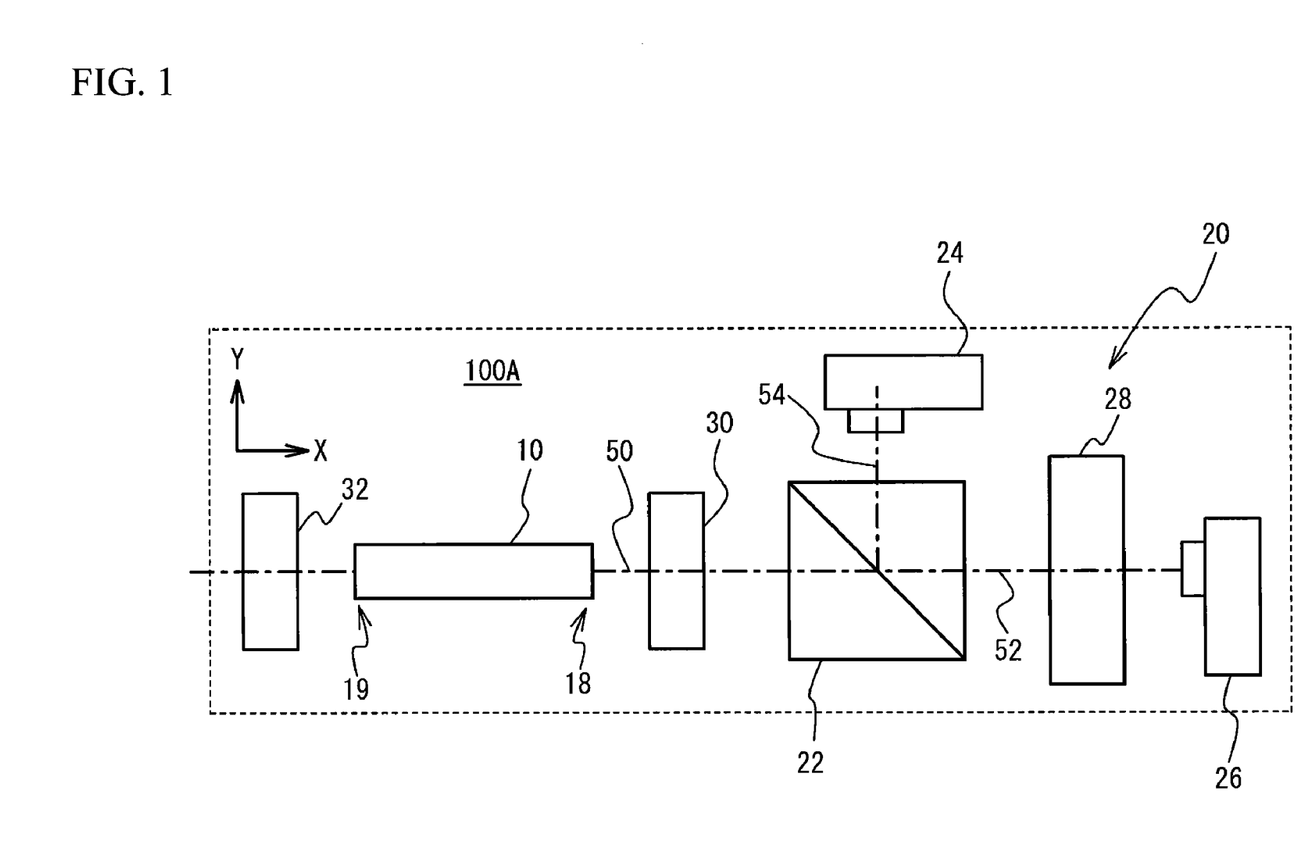
FIG. 1 illustrates a plane view of a semiconductor laser and therearound of a laser device in accordance with a first comparative example.

FIG. 1 illustrates a plane view of a semiconductor laser and therearound of a laser device 100A in accordance with a first comparative example. A semiconductor laser 10 of the laser device 100A has a first outputting end 18 and a second outputting end 19 for emitting a laser light. A wavelength locker 20 receives the laser light from the first outputting end 18 through a first lens 30. The laser light from the second outputting end 19 in an opposite side of the first outputting end 18 is emitted outward through a second lens 32.

Figure 2:
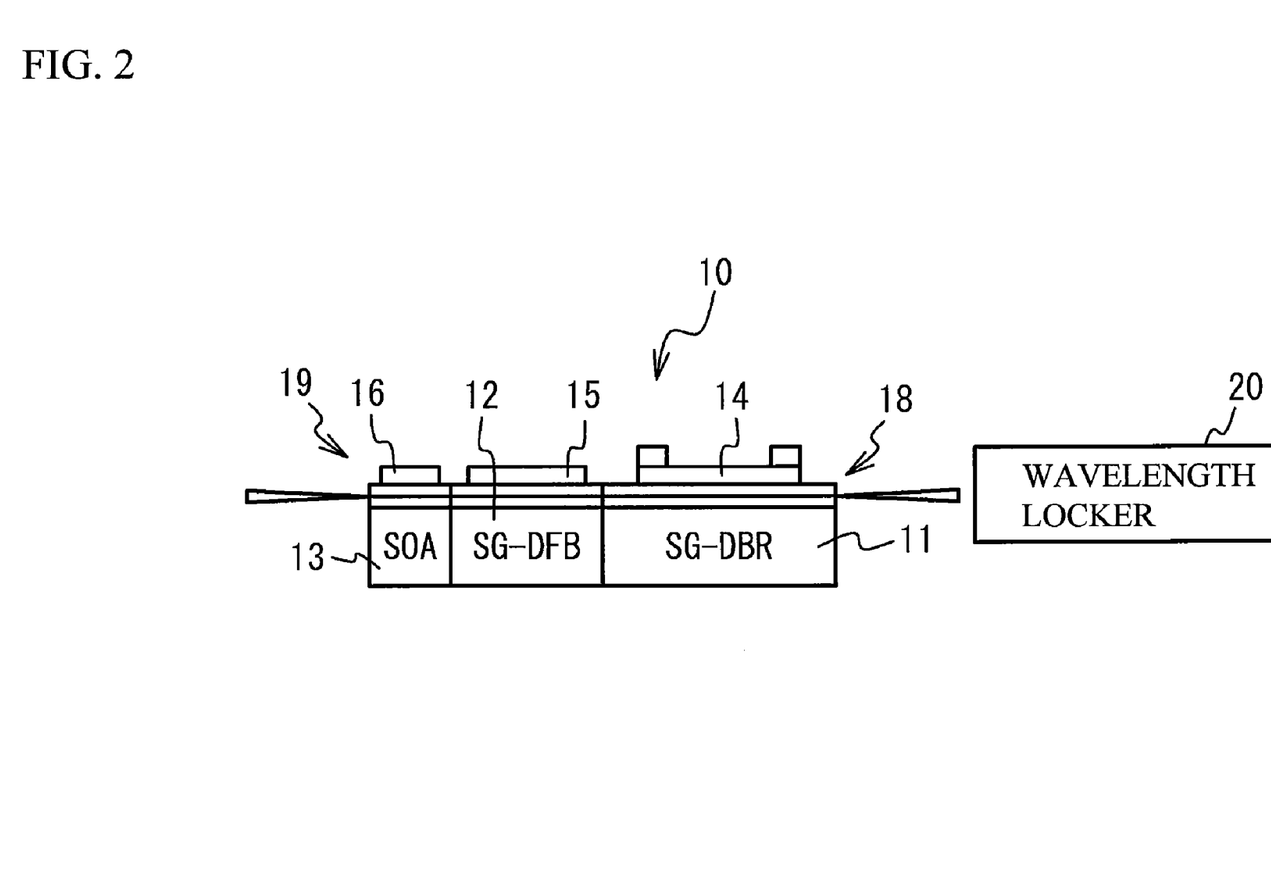
FIG. 2 illustrates a cross sectional view of the semiconductor laser of FIG. 1.

FIG. 2 illustrates a cross sectional view of the semiconductor laser 10 of FIG. 1. The semiconductor laser 10 is a wavelength tunable laser having a structure in which a SG-DBR region 11, a SG-DFB region 12, and a SOA region 13 are coupled in order.

The SG-DBR region 11 is a partial diffractive grating mirror of which peak wavelength appears periodically in reflection spectrum thereof, and has an optical waveguide having gratings at a given interval. An optical waveguide of the SG-DBR region 11 is made of semiconductor layer of which absorption edge wavelength is shorter than a laser oscillation wavelength thereof. A heater 14 is provided on the SG-DBR region 11. The heater 14 controls equivalent refractive index of the optical waveguide of the SG-DBR region 11 with use of heat.

The SG-DFB region 12 is a partial diffractive grating active region of which peak wavelength appears periodically in gain spectrum thereof, and has an optical waveguide having gratings at a given interval. The optical waveguide of the SG-DFB region 12 is made of semiconductor layer having gain with respect to the laser oscillation at an objective wavelength. An electrode 15 is provided on the SG-DFB region 12. The optical waveguide of the SG-DFB region 12 generates a light when electrical current is provided to the electrode 15.

The SOA region 13 includes an optical waveguide made of semiconductor layer giving gain to a light or absorbing a light with current control. An electrode 16 is provided on the SOA region 13. An emitted light of the semiconductor laser 10 is controlled with current provided to the electrode 16.

The optical waveguides of the SG-DBR region 11, the SG-DFB region 12, and the SOA region 13 are optically coupled to each other. In FIG. 2, the SG-DBR region 11 is arranged on the first outputting end 18 side, and the SOA region 13 is arranged on the second outputting end 19 side. However, the SG-DBR region 11 and the SOA region 13 are reversed.

In the following description including FIG. 3 through FIG. 6, a first output optical axis 50 from the first outputting end 18 of the semiconductor laser 10 is referred to as a reference axis, a direction in parallel with the first output optical axis 50 is X-direction, and a direction at right angle with the first output optical axis 50 is Y-direction.

As illustrated in FIG. 1, the wavelength locker 20 includes a beam splitter 22, light-receiving elements 24 and 26, and an etalon 28. The beam splitter 22 splits the emitted light from the semiconductor laser 10 into the X-direction and the Y-direction. The light-receiving element 24 is located on a second split axis 54 in the Y-direction. The etalon 28 and the light-receiving element 26 are located on a first split axis 52 in the X-direction. The etalon 28 is closer to the beam splitter 22 than the light-receiving element 26.

The light-receiving element 24 receives the light emitted from the semiconductor laser 10 not passing through the etalon 28, and detects optical intensity of the emitted light. Transmittance of the etalon 28 with respect to wavelength changes periodically. Therefore, the etalon 28 selectively transmits light of a specific wavelength. The light-receiving element 26 receives the light emitted from the semiconductor laser 10 having passed through the etalon 28, and detects a wavelength of the light emitted from the semiconductor laser 10 with use of a ratio between the optical intensity detected by the light-receiving element 24 and the optical intensity detected by the light-receiving element 26. Thus, the wavelength locker 20 detects both the optical intensity and the wavelength of the light emitted from the semiconductor laser 10. The detection result is used in a feedback control and so on of the semiconductor laser 10 acting as a wavelength tunable laser.

In the following description, the light-receiving element located solely is referred to as a first light-receiving element, and the light-receiving element located with the etalon is referred to as a second light-receiving element, on the two optical axes from the beam splitter 22. In the following description, the light-receiving element 24 acts as the first light-receiving element, and the light-receiving element 26 acts as the second light-receiving element. A second unit including the light-receiving element 26 and the etalon 28 has more components than a first unit including the light-receiving element 24. Therefore, a distance from the beam splitter 22 to an end of the second unit is longer than that from the beam splitter 22 to an end of the first unit.

In the laser device 100A in accordance with the first comparative example, longitudinal direction of the semiconductor laser 10 is arranged to be parallel with the first output optical axis 50. As illustrated in FIG. 2, the semiconductor laser 10 is a wavelength tunable laser having the SG-DBR region 11, the SG-DFB region 12 and the SOA region 13. Therefore, the semiconductor laser 10 is longer than other lasers without the regions. The laser device 100A is long in the X-direction, because the unit having more components is located on the first split axis 52 in the X-direction. It is therefore difficult to downsize the laser device 100A.

Second Comparative Example

Figure 3:
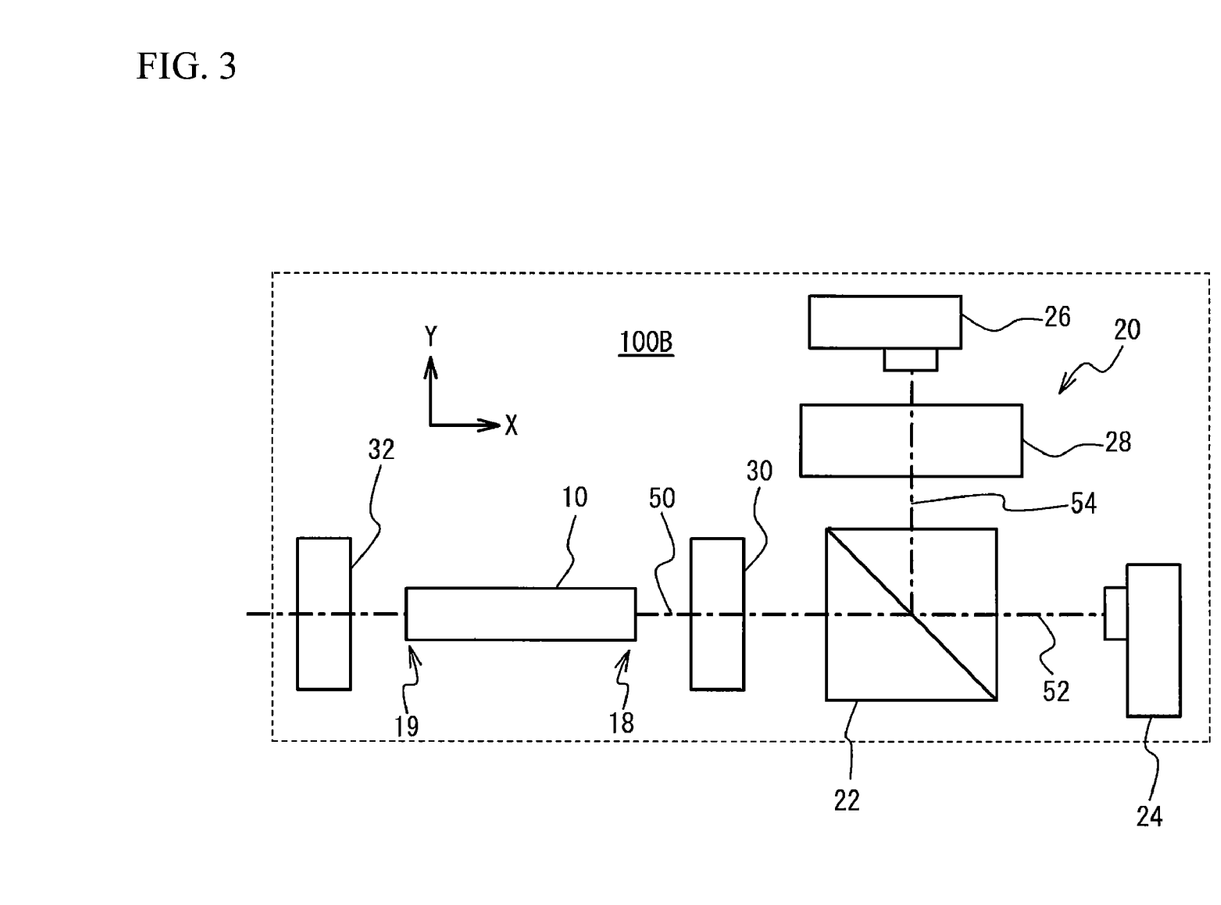
FIG. 3 illustrates a top view of a semiconductor laser and therearound of a laser device in accordance with a second comparative example.

FIG. 3 illustrates a top view of a semiconductor laser and therearound of a laser device 100B in accordance with a second comparative example. The same components as those illustrated in FIG. 1 (the first comparative example) have the same reference numerals in order to avoid a duplicated explanation.

The light-receiving element 24 is located on the first split axis 52 from the beam splitter 22 in the X-direction, and the etalon 28 and the light-receiving element 26 are located on the second split axis 54 in the Y-direction, in the laser device 100B. The etalon 28 is closer to the beam splitter 22 than the light-receiving element 26. That is, a positional relation of the light-receiving element 24, the light-receiving element 26 and the etalon 28 with respect to the spectral light of the beam splitter 22 is reverse with respect to the first comparative example. In concrete, the light-receiving element 26 and the etalon 28 are located on the split axis having larger split angle of the beam splitter 22.

The length in the X-direction of the laser device 100B in accordance with the second comparative example may be reduced more than the first comparative example, when the light-receiving element 24 is located on the first split axis 52 in the X-direction. However, it is necessary to provide the unit having more components on the second split axis 54 in the Y-direction. In this case, the length in the Y-direction of the laser device 100B may be enlarged more than that of the first comparative example. This results in generation of unnecessary space in an area in parallel with the semiconductor laser 10 along the second split axis 54.

As mentioned above, it is difficult to downsize the laser devices in accordance with the first and the second comparative examples.

(Principle of the Invention)

The invention has the following structure.

Figure 4:
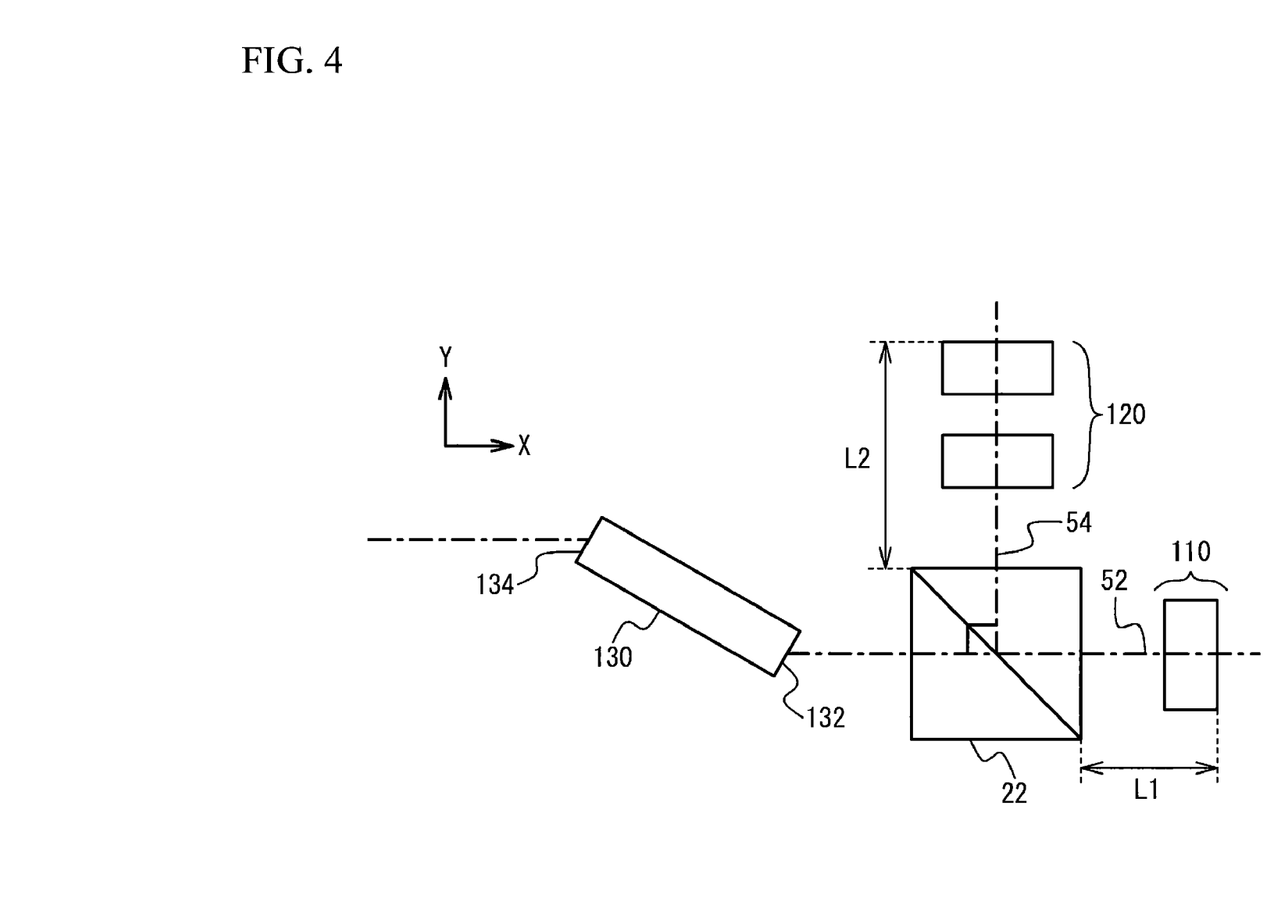
FIG. 4 illustrates a principle of the invention.

FIG. 4 illustrates a principle of the invention. The same components as those illustrated in FIG. 1 through FIG. 3 (the first comparative example and the second comparative example) have the same reference numerals in order to avoid a duplicated explanation.

As illustrated in FIG. 4, a first unit 110 and a second unit 120 have an optical component respectively. The second unit 120 is located on the optical axis (the second split axis 54) having larger split angle of the beam splitter 22. A distance L2 from the beam splitter 22 to a more distant end of the second unit 120 is longer than a distance L1 from the beam splitter 22 to a more distant end of the first unit 110. This results in generation of unnecessary space, as mentioned above. In contrast, the invention has a structure in which a second outputting end 134 is inclined toward the second split axis 54 more than a first outputting end 132 in an optical semiconductor element 130. With the structure, the optical semiconductor element 130 may be located on the unnecessary space. This allows reduction of occupied area of the laser device.

The first unit 110 and the second unit 120 may have one or more optical components. The distance from the beam splitter 22 to the more distant end of the unit is larger when the number of the optical components is increased. However, there may be a case where the distance from the beam splitter 22 to more distant end of a unit having a single optical component may be longer than that to a more distant end of a unit having more than one optical component.

The optical components included in the both units are not limited to the light-receiving element, the etalon, or the combination thereof in the first and the second comparative example. For example, a mirror included in an external resonator may act as an optical component in the laser device. The optical semiconductor element 130 is not limited to a semiconductor laser, and has only to be an optical semiconductor having optical gain. The optical semiconductor element 130 may be an optical semiconductor amplifier or a wavelength tunable laser in which an optical modulator is integrated.

Embodiment

Figure 5:
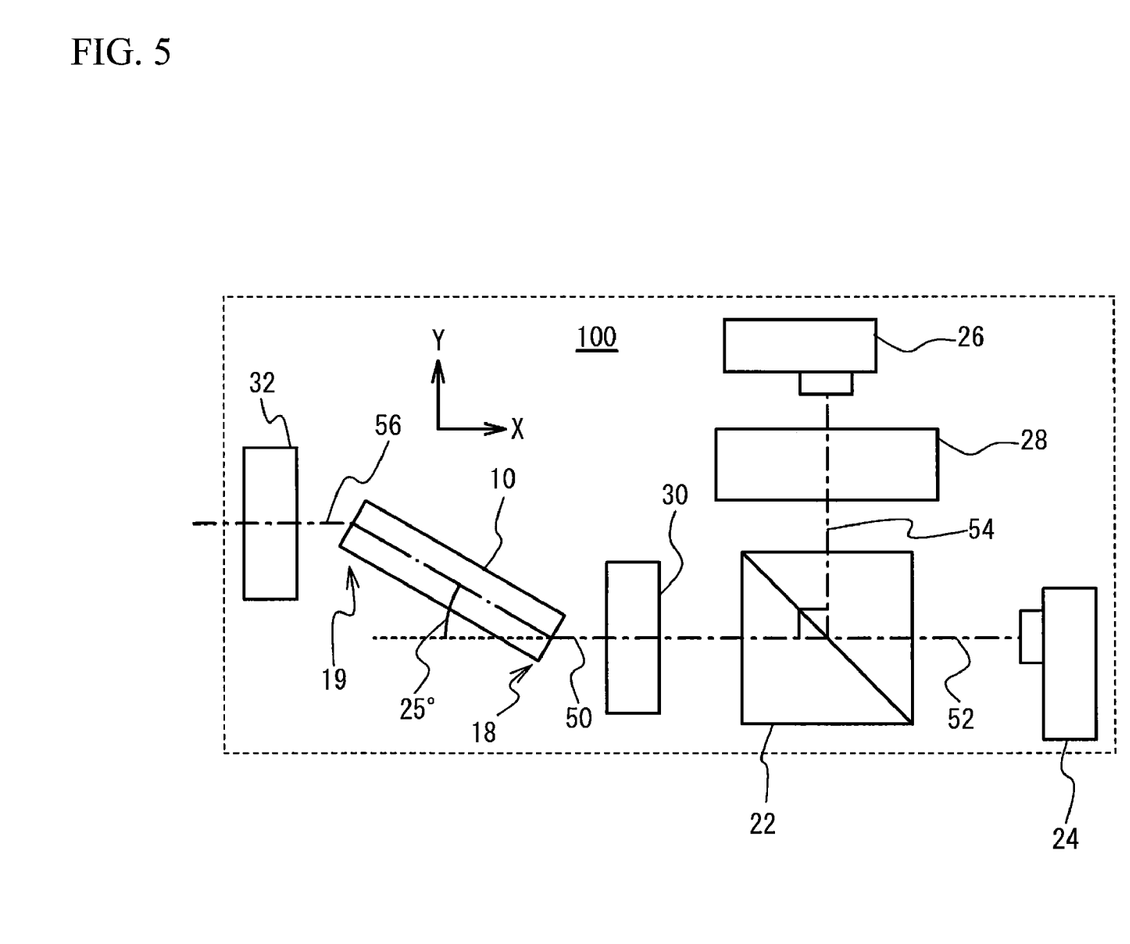
FIG. 5 illustrates a top view of a semiconductor laser and therearound of a laser device in accordance with an embodiment.

FIG. 5 illustrates a top view of a semiconductor laser and therearound of a laser device 100 in accordance with an embodiment. The same components as those illustrated in FIG. 1 (the first comparative example) and FIG. 3 (the second comparative example) have the same reference numerals in order to avoid a duplicated explanation. The semiconductor laser 10 is a wavelength tunable laser, and has the same structure as the first comparative example as illustrated in FIG. 2.

In the laser device 100 in accordance with the embodiment, the semiconductor laser 10 is arranged so that longitudinal direction of the semiconductor laser 10 is inclined with respect to the first output optical axis 50 from the first outputting end 18. As illustrated in FIG. 5, the inclination angle of the semiconductor laser 10 with respect to the first output optical axis 50 is 25 degrees. In order to arrange the semiconductor laser 10 to be inclined with respect to the first output optical axis 50, the outputting end face may be inclined, or an optical waveguide at the first outputting end 18 and the second outputting end 19 may be inclined to the semiconductor laser 10. A second output optical axis 56 from the second outputting end 19 is arranged to be parallel with the first output optical axis 50 from the first outputting end 18.

The wavelength locker 20 has the same structure as the second comparative example. The light-receiving element 24 is located on the first split axis 52 in the X-direction. A unit including the light-receiving element 26 and the etalon 28 is located on the second split axis 54 in the Y-direction.

In the laser device 100 in accordance with the embodiment, the unit having more components is located on the optical axis in the Y-direction. Therefore, the laser device 100 has less length in the X-direction than the first comparative example. The semiconductor laser 10 has less length in the X-direction than the second comparative example because the semiconductor laser 10 is inclined with respect to the first output optical axis 50. Thus, the laser device 100 may have less length in the X-direction than the first and the second comparative example.

In the laser device 100 in accordance with the embodiment, the unit including the etalon 28 is located on the same side as the second outputting end 19 of the semiconductor laser 10 with respect to the first output optical axis 50 from the first outputting end 18. Therefore, the length of the laser device 100 may be reduced in the Y-direction, compared to the second comparative example.

The length of the laser device 100 in the X-direction is reduced, compared to the laser device 100A in accordance with the first comparative example. Therefore, the laser device 100 is downsized. The length of the laser device 100 in the Y-direction is reduced according to the inclination of the semiconductor laser 10, compared to the laser device 100B in accordance with the second comparative example. And the laser device 100 has the same length in the Y-direction as the laser device 100B. Therefore, the device size of the laser device 100 is more reduced than the first and the second comparative example, because a packaging area of the semiconductor laser 10 and therearound (an area surrounded with a broken line in FIG. 1, FIG. 3, and FIG. 5) is reduced.

In the embodiment, the beam splitter 22 splits the light emitted from the first outputting end 18 of the semiconductor laser 10 into the two lights in the X-direction and the Y-direction. However, the spectral directions are not limited to the X-direction and the Y-direction. For example, an angle between the first output optical axis 50 (a reference axis) and the first split axis 52 may be in a range of −10 degrees to +10 degrees with respect to the X-direction. An angle between the first output optical axis 50 and the second split axis 54 may be in a range of −10 degrees to +10 degrees with respect to the Y-direction. In this case, the light-receiving element 26 and the etalon 28 are located on the second split axis 54 that is closer to the Y-direction (plus minus 10 degrees with respect to the Y-direction). In other words, the light-receiving element 26 and the etalon 28 have only to be positioned on the same side as the second outputting end 19 of the semiconductor laser 10 with respect to the first output optical axis 50 from the first outputting end 18 of the semiconductor laser 10. With the structure, the packaging area of the semiconductor laser 10 and the optical components of the wavelength locker 20 may be reduced, compared to the first and the second comparative examples.

In the embodiment, the semiconductor laser 10 is inclined with respect to the first output optical axis 50 at an inclination angle of 25 degrees. However, the inclination angle is not limited to the value. It is preferable that the inclination angle of the semiconductor laser 10 is in a range of 20 degrees to 30 degrees with respect to the first output optical axis 50.

In the embodiment, the semiconductor laser 10 includes the SG-DBR region 11, the SG-DFB region 12, and the SOA region 13. However, the semiconductor laser 10 may have another structure. The semiconductor laser 10 may be other than the wavelength tunable laser. However, the wavelength tunable laser generally has relatively large length. Therefore, the wavelength tunable laser is suitable for the embodiment.

Next, description will be given of an overall structure of the laser device 100 including the semiconductor laser 10 in accordance with the embodiment.

Figure 6:
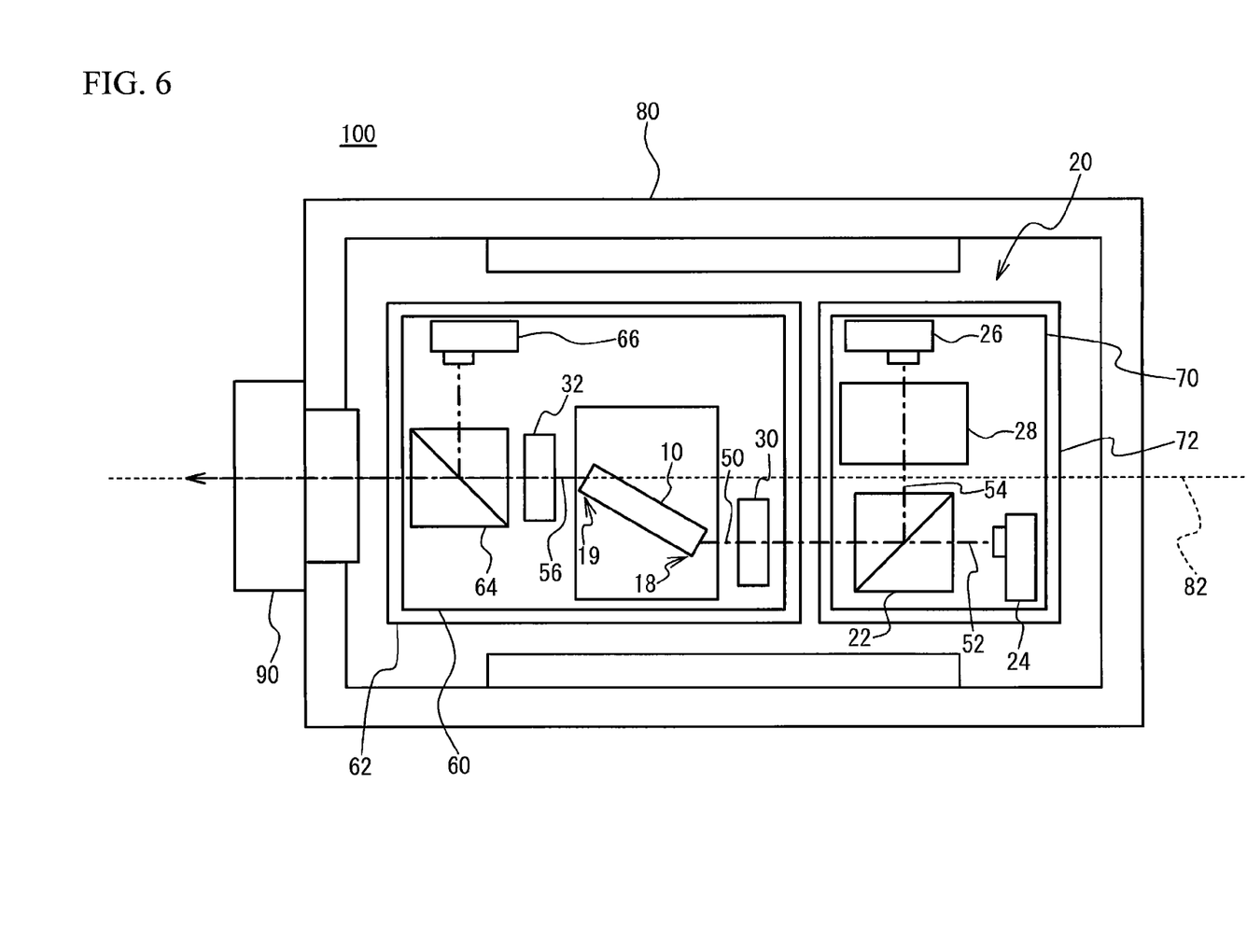
FIG. 6 illustrates a top view of the laser device in accordance with the embodiment.

FIG. 6 illustrates a top view of the laser device 100. The same components as those illustrated in FIG. 5 have the same reference numerals in order to avoid a duplicated explanation. As illustrated in FIG. 6, a package 80 includes a first carrier 60 and a second carrier 70. The first carrier 60 is provided on a first temperature control device 62. The second carrier 70 is provided on a second temperature control device 72.

The semiconductor laser 10, the first lens 30, and the second lens 32 of FIG. 5 are provided on the first carrier 60. Further, a second beam splitter 64 and a light-receiving element 66 are provided on the first carrier 60. The second beam splitter 64 splits a light emitted from the second outputting end 19 of the semiconductor laser 10 into a light in a direction (the Y-direction) toward the light-receiving element 66 and a light in a direction (the X-direction) toward outside. The light-receiving element 66 receives the lights split by the second beam splitter 64, and detects the light emitted from the laser device 100 to outside.

The beam splitter 22 (the same as the beam splitter 22 of FIG. 5), the light-receiving element 24, the light-receiving element 26, and the wavelength locker 20 including the etalon 28 are provided on the second carrier 70 separated away from the first carrier 60. The second temperature control device 72 under the second carrier 70 controls the temperature of the optical components of the wavelength locker 20.

An outputting portion 90 emits a light emitted from the second outputting end 19 of the semiconductor laser 10. In this case, it is preferable that the second output optical axis 56 from the second outputting end 19 is overlapped with a center axis 82 of the package 80.

The packaging area of the laser device 100 of FIG. 6 is reduced because the semiconductor laser 10 and the wavelength locker 20 are located as illustrated in FIG. 5. Therefore the laser device 100 is downsized.

In the laser device 100 of FIG. 6, the semiconductor laser 10 is provided on the first temperature control device 62. And, the beam splitter 22, the light-receiving element 24, the light-receiving element 26 and the etalon 28 are provided on the second temperature control device 72. The optical components may be provided on a single temperature control device in common. However, it is restrained that temperature changing according to the wavelength control of the semiconductor laser 10 influences on the optical components of the wavelength locker 20, if the optical components are separately provided on different temperature control devices. Especially, the etalon 28 is susceptible to the effect of the temperature changing. It is therefore preferable that the etalon 28 is not provided on the first temperature control device 62 but on the second temperature control device 72.

The present invention is not limited to the specifically disclosed embodiments and variations but may include other embodiments and variations without departing from the scope of the present invention.

What is claimed is:

1. An optical semiconductor device comprising:
    a beam splitter that receives an input optical axis and splits the input optical axis into a first split axis and a second split axis;
    a first unit that is located on the first split axis of the beam splitter and has one or more optical components, an interval between a more distant end of the first unit and the beam splitter having a first length;
    a second unit that is located on the second split axis of the beam splitter and has one or more optical components, an interval between a more distant end of the second unit and the beam splitter having a second length larger than the first length; and
    an optical semiconductor element that is a wavelength tunable laser and has a first outputting end having a first output axis coupled optically to the input optical axis of the beam splitter, a second outputting end having a second output axis, and an optical gain,
    the first output axis of the optical semiconductor element and the first split axis of the beam splitter being on a common straight line,
    the first output axis of the optical semiconductor element and the second split axis of the beam splitter crossing at the beam splitter,
    the optical semiconductor element being inclined so that the second output axis is arranged away to a side of the second split axis from the first output axis.

2. The optical semiconductor device as claimed in claim 1, wherein:
    the first unit includes a first light-receiving element; and
    the second unit includes an etalon and a second light-receiving element receiving a light having passed through the etalon.

3. The optical semiconductor device as claimed in claim 1, wherein the wavelength tunable laser has a structure in which a SG-DBR (Sampled Grating Distributed Bragg Reflector), a SG-DFB (Sampled Grating Distributed Feedback), and a SOA (Semiconductor Optical Amplifier) are coupled.

4. The optical semiconductor device as claimed in claim 2, wherein the wavelength tunable laser has a structure in which a SG-DBR (Sampled Grating Distributed Bragg Reflector), a SG-DFB (Sampled Grating Distributed Feedback), and a SOA (Semiconductor Optical Amplifier) are coupled.

5. The optical semiconductor device as claimed in claim 1, wherein an optical axis of the second outputting end is substantially the same as a center axis of a package on which the optical semiconductor element is provided.

6. The optical semiconductor device as claimed in claim 2, wherein an optical axis of the second outputting end is substantially the same as a center axis of a package on which the optical semiconductor element is provided.

7. The optical semiconductor device as claimed in claim 3, wherein an optical axis of the second outputting end is substantially the same as a center axis of a package on which the optical semiconductor element is provided.

8. The optical semiconductor device as claimed in claim 4, wherein an optical axis of the second outputting end is substantially the same as a center axis of a package on which the optical semiconductor element is provided.

* * * * *